(12) United States Patent
Choi et al.

(10) Patent No.: US 8,067,821 B1
(45) Date of Patent: Nov. 29, 2011

(54) FLAT SEMICONDUCTOR PACKAGE WITH HALF PACKAGE MOLDING

(75) Inventors: YeonHo Choi, Chandler, AZ (US); Timothy L. Olson, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 562 days.

(21) Appl. No.: 12/100,886

(22) Filed: Apr. 10, 2008

(51) Int. Cl.
*H01L 23/495* (2006.01)

(52) U.S. Cl. ........ 257/666; 257/667; 257/784; 257/777; 257/E23.037; 257/E23.046

(58) Field of Classification Search .................. 257/666, 257/676, 784, E23.037, E23.046, 671, 777
See application file for complete search history.

(56) References Cited

U.S. PATENT DOCUMENTS

| | | | |
|---|---|---|---|
| 2,596,993 | A | 5/1952 | Gookin |
| 3,435,815 | A | 4/1969 | Forcier |
| 3,734,660 | A | 5/1973 | Davies et al. |
| 3,838,984 | A | 10/1974 | Crane et al. |
| 4,054,238 | A | 10/1977 | Lloyd et al. |
| 4,189,342 | A | 2/1980 | Kock |
| 4,221,925 | A | 9/1980 | Finley et al. |
| 4,258,381 | A | 3/1981 | Inaba |
| 4,289,922 | A | 9/1981 | Devlin |
| 4,301,464 | A | 11/1981 | Otsuki et al. |
| 4,332,537 | A | 6/1982 | Slepcevic |
| 4,417,266 | A | 11/1983 | Grabbe |
| 4,451,224 | A | 5/1984 | Harding |
| 4,530,152 | A | 7/1985 | Roche et al. |
| 4,541,003 | A | 9/1985 | Otsuka et al. |
| 4,646,710 | A | 3/1987 | Schmid et al. |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Cuong Q Nguyen
*Assistant Examiner* — Cathy N Lam
(74) *Attorney, Agent, or Firm* — Stetina Brunda Garred & Brucker (57) ABSTRACT

In accordance with the present invention, there are provided multiple embodiments of a semiconductor package, each embodiment including a uniquely configured leadframe sized and configured to maximize the available number of exposed leads in the semiconductor package. More particularly, each embodiment of the semiconductor package of the present invention includes a generally planar die paddle defining multiple peripheral edge segments and a plurality of leads, the exposed portions of the bottom surfaces of which are segregated into at least two concentric rows. Connected to the top surface of the die paddle is at least one semiconductor die which is electrically connected to at least some of the leads of each row. At least portions of the die paddle, the leads, and the semiconductor die are encapsulated by a package body, the bottom surfaces of the die paddle and the leads of both rows thereof being exposed in a common exterior surface of the package body. In certain embodiments of the present invention, the top surfaces of at least some of leads of the leadframe are also exposed in an exterior surface of the package body.

14 Claims, 6 Drawing Sheets

U.S. PATENT DOCUMENTS

| | | | |
|---|---|---|---|
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorpe, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Sclesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,285,352 A | 2/1994 | Pastore et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,434,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,467,032 A | 11/1995 | Lee |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,637,922 A | 6/1997 | Fillion et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,683,943 A | 11/1997 | Yamada |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,767,566 A | 6/1998 | Suda |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davies et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,854,511 A | 12/1998 | Shin et al. |
| 5,854,512 A | 12/1998 | Manteghi |
| 5,856,911 A | 1/1999 | Riley |
| 5,859,471 A | 1/1999 | Kuraishi et al. |
| 5,866,939 A | 2/1999 | Shin et al. |
| 5,866,942 A | 2/1999 | Suzuki et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,973,935 A | 10/1999 | Schoenfeld et al. |
| 5,977,630 A | 11/1999 | Woodworth et al. |
| RE36,773 E | 7/2000 | Nomi et al. |
| 6,107,679 A | 8/2000 | Noguchi |
| 6,143,981 A | 11/2000 | Glenn |
| 6,150,709 A | 11/2000 | Shin et al. |
| 6,157,074 A | 12/2000 | Lee |
| 6,166,430 A | 12/2000 | Yamaguchi |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |

| | | | | | | |
|---|---|---|---|---|---|---|
| 6,197,615 | B1 | 3/2001 | Song et al. | 6,476,474 | B1 | 11/2002 | Hung |
| 6,198,171 | B1 | 3/2001 | Huang et al. | 6,482,680 | B1 | 11/2002 | Khor et al. |
| 6,201,186 | B1 | 3/2001 | Daniels et al. | 6,483,178 | B1 | 11/2002 | Chuang |
| 6,201,292 | B1 | 3/2001 | Yagi et al. | 6,492,718 | B2 | 12/2002 | Ohmori et al. |
| 6,204,554 | B1 | 3/2001 | Ewer et al. | 6,495,909 | B2 | 12/2002 | Jung et al. |
| 6,208,020 | B1 | 3/2001 | Minamio et al. | 6,498,099 | B1 | 12/2002 | McClellan et al. |
| 6,208,021 | B1 | 3/2001 | Ohuchi et al. | 6,498,392 | B2 | 12/2002 | Azuma |
| 6,208,023 | B1 | 3/2001 | Nakayama et al. | 6,507,096 | B2 | 1/2003 | Gang |
| 6,211,462 | B1 | 4/2001 | Carter, Jr. et al. | 6,507,120 | B2 | 1/2003 | Lo et al. |
| 6,218,731 | B1 | 4/2001 | Huang et al. | 6,518,089 | B2 | 2/2003 | Coyle |
| 6,222,258 | B1 | 4/2001 | Asano et al. | 6,525,942 | B2 | 2/2003 | Huang et al. |
| 6,222,259 | B1 | 4/2001 | Park et al. | 6,528,893 | B2 | 3/2003 | Jung et al. |
| 6,225,146 | B1 | 5/2001 | Yamaguchi et al. | 6,534,849 | B1 | 3/2003 | Gang |
| 6,229,200 | B1 | 5/2001 | McClellan et al. | 6,545,332 | B2 | 4/2003 | Huang |
| 6,229,205 | B1 | 5/2001 | Jeong et al. | 6,545,345 | B1 | 4/2003 | Glenn et al. |
| 6,238,952 | B1 | 5/2001 | Lin et al. | 6,552,421 | B2 | 4/2003 | Kishimoto et al. |
| 6,239,367 | B1 | 5/2001 | Hsuan et al. | 6,559,525 | B2 | 5/2003 | Huang |
| 6,239,384 | B1 | 5/2001 | Smith et al. | 6,566,168 | B2 | 5/2003 | Gang |
| 6,242,281 | B1 | 6/2001 | McClellan et al. | 6,580,161 | B2 | 6/2003 | Kobayakawa |
| 6,256,200 | B1 | 7/2001 | Lam et al. | 6,583,503 | B2 | 6/2003 | Akram et al. |
| 6,258,629 | B1 | 7/2001 | Niones et al. | 6,585,905 | B1 | 7/2003 | Fan et al. |
| 6,261,864 | B1 | 7/2001 | Jung et al. | 6,603,196 | B2 | 8/2003 | Lee et al. |
| 6,281,566 | B1 | 8/2001 | Magni | 6,624,005 | B1 | 9/2003 | DiCaprio et al. |
| 6,281,568 | B1 | 8/2001 | Glenn et al. | 6,627,977 | B1 | 9/2003 | Foster |
| 6,282,094 | B1 | 8/2001 | Lo et al. | 6,646,339 | B1 | 11/2003 | Ku |
| 6,282,095 | B1 | 8/2001 | Houghton et al. | 6,667,546 | B2 | 12/2003 | Huang et al. |
| 6,285,075 | B1 | 9/2001 | Combs et al. | 6,677,663 | B1 | 1/2004 | Ku et al. |
| 6,291,271 | B1 | 9/2001 | Lee et al. | 6,686,649 | B1 | 2/2004 | Matthews et al. |
| 6,291,273 | B1 | 9/2001 | Miyaki et al. | 6,696,752 | B2 | 2/2004 | Su et al. |
| 6,294,100 | B1 | 9/2001 | Fan et al. | 6,700,189 | B2 | 3/2004 | Shibata |
| 6,294,830 | B1 | 9/2001 | Fjelstad | 6,713,375 | B2 | 3/2004 | Shenoy |
| 6,295,977 | B1 | 10/2001 | Ripper et al. | 6,757,178 | B2 | 6/2004 | Okabe et al. |
| 6,297,548 | B1 | 10/2001 | Moden et al. | 6,800,936 | B2 | 10/2004 | Kosemura et al. |
| 6,303,984 | B1 | 10/2001 | Corisis | 6,812,552 | B2 | 11/2004 | Islam et al. |
| 6,303,997 | B1 | 10/2001 | Lee | 6,818,973 | B1 | 11/2004 | Foster |
| 6,306,685 | B1 | 10/2001 | Liu et al. | 6,858,919 | B2 | 2/2005 | Seo et al. |
| 6,307,272 | B1 | 10/2001 | Takahashi et al. | 6,867,492 | B2 | 3/2005 | Auburger et al. |
| 6,309,909 | B1 | 10/2001 | Ohgiyama | 6,876,068 | B1 | 4/2005 | Lee et al. |
| 6,316,822 | B1 | 11/2001 | Venkateshwaran et al. | 6,878,571 | B2 | 4/2005 | Isaak et al. |
| 6,316,838 | B1 | 11/2001 | Ozawa et al. | 6,897,552 | B2 | 5/2005 | Nakao |
| 6,323,550 | B1 | 11/2001 | Martin et al. | 6,927,478 | B2 | 8/2005 | Paek |
| 6,326,243 | B1 | 12/2001 | Suzuya et al. | 6,967,125 | B2 | 11/2005 | Fee et al. |
| 6,326,244 | B1 | 12/2001 | Brooks et al. | 6,995,459 | B2 | 2/2006 | Lee et al. |
| 6,326,678 | B1 | 12/2001 | Karmezos et al. | 7,002,805 | B2 | 2/2006 | Lee et al. |
| 6,335,564 | B1 | 1/2002 | Pour | 7,005,327 | B2 | 2/2006 | Kung et al. |
| 6,337,510 | B1 | 1/2002 | Chun-Jen et al. | 7,015,571 | B2 | 3/2006 | Chang et al. |
| 6,339,252 | B1 | 1/2002 | Niones et al. | 7,045,396 | B2 | 5/2006 | Crowley et al. |
| 6,339,255 | B1 | 1/2002 | Shin | 7,053,469 | B2 | 5/2006 | Koh et al. |
| 6,342,730 | B1 | 1/2002 | Jung et al. | 7,075,816 | B2 | 7/2006 | Fee et al. |
| 6,348,726 | B1 | 2/2002 | Bayan et al. | 7,102,209 | B1 | 9/2006 | Bayan et al. |
| 6,355,502 | B1 | 3/2002 | Kang et al. | 7,109,572 | B2 | 9/2006 | Fee et al. |
| 6,359,221 | B1 | 3/2002 | Yamada et al. | 7,185,426 | B1 | 3/2007 | Hiner et al. |
| 6,362,525 | B1 | 3/2002 | Rahim | 7,193,298 | B2 | 3/2007 | Hong et al. |
| 6,369,447 | B2 | 4/2002 | Mori | 7,211,471 | B1 | 5/2007 | Foster |
| 6,369,454 | B1 | 4/2002 | Chung | 7,245,007 | B1 | 7/2007 | Foster |
| 6,373,127 | B1 | 4/2002 | Baudouin et al. | 7,253,503 | B1 | 8/2007 | Fusaro et al. |
| 6,377,464 | B1 | 4/2002 | Hashemi et al. | 2001/0008305 | A1 | 7/2001 | McClellan et al. |
| 6,380,048 | B1 | 4/2002 | Boon et al. | 2001/0014538 | A1 | 8/2001 | Kwan et al. |
| 6,384,472 | B1 | 5/2002 | Huang | 2002/0011654 | A1 | 1/2002 | Kimura |
| 6,388,336 | B1 | 5/2002 | Venkateshwaran et al. | 2002/0024122 | A1 | 2/2002 | Jung et al. |
| 6,395,578 | B1 | 5/2002 | Shin et al. | 2002/0027297 | A1 | 3/2002 | Ikenaga et al. |
| 6,399,415 | B1 | 6/2002 | Bayan et al. | 2002/0038873 | A1 | 4/2002 | Hiyoshi |
| 6,400,004 | B1 | 6/2002 | Fan et al. | 2002/0072147 | A1 | 6/2002 | Sayanagi et al. |
| 6,410,979 | B2 | 6/2002 | Abe | 2002/0111009 | A1 | 8/2002 | Huang et al. |
| 6,414,385 | B1 | 7/2002 | Huang et al. | 2002/0140061 | A1 | 10/2002 | Lee |
| 6,420,779 | B1 | 7/2002 | Sharma et al. | 2002/0140068 | A1 | 10/2002 | Lee et al. |
| 6,421,013 | B1 | 7/2002 | Chung | 2002/0140081 | A1 | 10/2002 | Chou et al. |
| 6,423,643 | B1 | 7/2002 | Furuhata et al. | 2002/0158318 | A1 | 10/2002 | Chen |
| 6,429,508 | B1 | 8/2002 | Gang | 2002/0163015 | A1 | 11/2002 | Lee et al. |
| 6,437,429 | B1 | 8/2002 | Su et al. | 2002/0167060 | A1 | 11/2002 | Buijsman et al. |
| 6,444,499 | B1 | 9/2002 | Swiss et al. | 2003/0006055 | A1 | 1/2003 | Chien-Hung et al. |
| 6,448,633 | B1 | 9/2002 | Yee et al. | 2003/0030131 | A1 | 2/2003 | Lee et al. |
| 6,452,279 | B2 | 9/2002 | Shimoda | 2003/0059644 | A1 | 3/2003 | Datta et al. |
| 6,459,148 | B1 | 10/2002 | Chun-Jen et al. | 2003/0064548 | A1 | 4/2003 | Isaak |
| 6,464,121 | B2 | 10/2002 | Reijnders | 2003/0073265 | A1 | 4/2003 | Hu et al. |
| 6,465,883 | B2 | 10/2002 | Oloffson | 2003/0102537 | A1 | 6/2003 | McLellan et al. |
| 6,472,735 | B2 | 10/2002 | Isaak | 2003/0164554 | A1 | 9/2003 | Fee et al. |
| 6,475,646 | B2 | 11/2002 | Park et al. | 2003/0168719 | A1 | 9/2003 | Cheng et al. |
| 6,476,469 | B2 | 11/2002 | Huang et al. | 2003/0198032 | A1 | 10/2003 | Collander et al. |

| | | | |
|---|---|---|---|
| 2004/0027788 A1 | 2/2004 | Chiu et al. | |
| 2004/0056277 A1 | 3/2004 | Karnezos | |
| 2004/0061212 A1 | 4/2004 | Karnezos | |
| 2004/0061213 A1 | 4/2004 | Karnezos | |
| 2004/0063242 A1 | 4/2004 | Karnezos | |
| 2004/0063246 A1 | 4/2004 | Karnezos | |
| 2004/0065963 A1 | 4/2004 | Karnezos | |
| 2004/0080025 A1 | 4/2004 | Kasahara et al. | |
| 2004/0089926 A1 | 5/2004 | Hsu et al. | |
| 2004/0097016 A1 | 5/2004 | Yee et al. | |
| 2004/0164387 A1 | 8/2004 | Ikenaga et al. | |
| 2004/0253803 A1 | 12/2004 | Tomono et al. | |
| 2005/0139969 A1* | 6/2005 | Lee et al. | 257/672 |
| 2005/0199987 A1 | 9/2005 | Danno et al. | |
| 2006/0087020 A1 | 4/2006 | Hirano et al. | |
| 2006/0157843 A1 | 7/2006 | Hwang | |
| 2006/0231939 A1 | 10/2006 | Kawabata et al. | |
| 2007/0023202 A1 | 2/2007 | Shibata | |
| 2007/0215990 A1* | 9/2007 | San Antonio et al. | 257/666 |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 3289162 | 12/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 652333 | 9/1994 |
| JP | 6252333 | 9/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

FLAT SEMICONDUCTOR PACKAGE WITH HALF PACKAGE MOLDING

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit package technology and, more particularly, to an increased capacity QFP semiconductor package which includes exposed leads and an exposed die pad on the bottom surface of the package body thereof, and exposed leads on the top surface of the package body thereof, thus making the semiconductor package suitable for stacking.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die pad of the leadframe also remains exposed within the package body.

One type of semiconductor package commonly known in the electronics field is referred to as a quad flat pack (QFP) package. A typical QFP package comprises a thin, generally square package body defining four peripheral sides of substantially equal length. Protruding from each of the four peripheral sides of the package body are a plurality of leads which each have a generally gull-wing configuration. Portions of the leads are internal to the package body, and are electrically connected to respective ones of the pads or terminals of a semiconductor die also encapsulated within the package body. The semiconductor die is itself mounted to a die pad of the QFP package leadframe. In certain types of QFP packages referred to as QFP exposed pad packages, one surface of the die pad is exposed within the bottom surface of the package body.

In the electronics industry and, in particular, in high frequency applications such hard disk drives, digital television and other consumer electronics, there is an increasing need for QFP exposed pad packages of increased functional capacity. The present invention provides such a QFP exposed pad package which includes exposed leads and an exposed die pad on the bottom surface of the package body thereof, and exposed leads on the top surface of the package body thereof, thus making the package suitable for stacking and more suitable for use in application which require, for example, increased memory. The semiconductor package of the present invention is provided through the use of standard, low-cost leadframe design techniques. These, as well as other features and attributes of the present invention will be discussed in more detail below.

BRIEF SUMMARY OF THE INVENTION

In accordance with the present invention, there are provided multiple embodiments of a semiconductor package, each embodiment including a uniquely configured leadframe sized and configured to maximize the available number of exposed leads in the semiconductor package. More particularly, each embodiment of the semiconductor package of the present invention includes a generally planar die paddle defining multiple peripheral edge segments and a plurality of leads, the exposed portions of the bottom surfaces of which are provided in at least one row, and may be segregated into at least two concentric rows. Connected to the top surface of the die paddle is at least one semiconductor die which is electrically connected to at least some of the leads of each row. At least portions of the die paddle, the leads, and the semiconductor die are encapsulated by a package body, the bottom surfaces of the die paddle and the leads of both rows thereof being exposed in a common exterior surface of the package body. In certain embodiments of the present invention, the top surfaces of at least some of leads of the leadframe are also exposed in an exterior surface of the package body. The leadframe of each embodiment of the semiconductor package is fabricated in accordance with standard, low-cost forming techniques. In accordance with the present invention, sawing, punching, etching, or other material removal processes may be completed during the fabrication of the semiconductor package to effectively electrically isolate various leads from each other within the semiconductor package. The semiconductor package of the present invention may include one or more internal semiconductor dies, depending on functional requirements.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Referring now to the drawings wherein the showings are for purposes of illustrating various embodiments of the present invention only, and not for purposes of limiting the same, FIGS. 1-4 depict a semiconductor package 10 constructed in accordance with a first embodiment of the present invention. The major structural elements of the semiconductor package 10 include a leadframe 12 (shown in FIG. 4), a semiconductor die 14 attached to the leadframe 12 and electrically connected thereto by conductive wires 16, and a package body 18 which fully encapsulates the semiconductor die 14 and wires 16, and partially encapsulates the leadframe 12 in a manner which will be described in more detail below.

Figure 4:
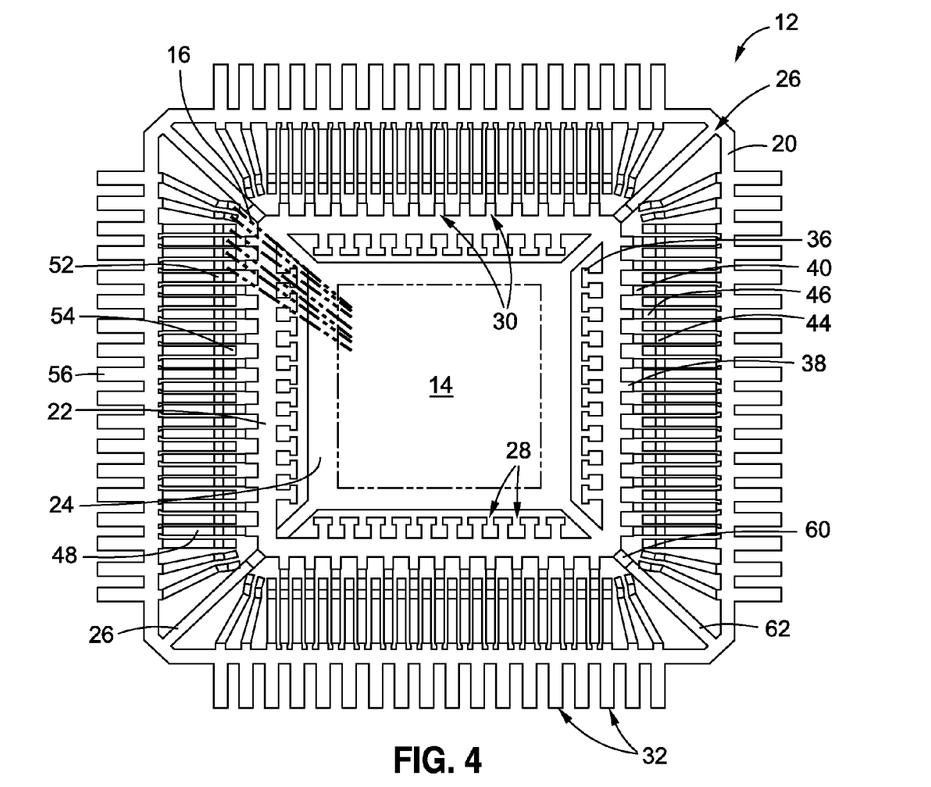
FIG. 4 is a top plan view of the unsingulated leadframe which is integrated into the semiconductor package of the first embodiment of the present invention, further depicting in phantom the semiconductor die and exemplary conductive wires of the semiconductor package.

As best seen in FIG. 4, the leadframe 12 of the semiconductor package 10 includes a peripheral outer dambar 20. Located within outer dambar 20 is a continuous, generally quadrangular tie ring 22. Disposed within the tie ring 22 is a generally quadrangular die paddle 24 of the leadframe 12. The die paddle 24 defines opposed, generally planar top and bottom paddle surfaces, and is connected to both the tie ring 22 and the dambar 20 by a plurality of tie bars 26 which extend diagonally from respective ones of the four corners defined by the die paddle 24.

In addition to the die paddle 24, the leadframe 12 of the semiconductor package 10 comprises a plurality of first leads 28 which are each integrally connected to the tie ring 22 and extend inwardly toward the die paddle 24 in spaced relation thereto, and a plurality of second leads 30 which are each integrally connected to and extend between the tie ring 22 and the dambar 20. In addition to the first and second leads 28, 30, the leadframe 12 includes a plurality of third leads 32 which are each integrally connected to the dambar 20. As seen in FIG. 4, the first leads 28 and the second leads 30 are each segregated into four sets, with the first leads 28 and the second leads 30 of each set extending along a respective one of the four peripheral edge segments defined by the die paddle 24. The third leads 32 are also segregated into four sets, with the third leads 32 of each set extending along a respective one of the four peripheral edge segments defined by the die paddle 24 in spaced relation thereto. Thus, the first, second and third leads 28, 30, 32 are generally arranged as three concentric rings, the first leads 28 defining an inner ring which is circumvented or circumscribed by a middle ring defined by the second leads 30, such middle ring itself being circumvented by an outer ring defined by the third leads 32.

As further seen in FIG. 4, some of the third leads 32 of each set thereof are interleaved with the second leads 30 of the corresponding set, i.e., portions of certain ones of the third leads 32 of each set extend between and in spaced relation to a respective pair of the second leads 30 of the corresponding set thereof. Those third leads 32 of each set which extend between a respective pair of the second leads 30 are each generally straight, though being bent to define a downset as will be described in more detail below. The majority of those third leads 32 of each set which are not interleaved with the second leads 30 of the corresponding set each preferably have an angled portion which also includes a downset formed therein. More particularly, in those third leads 32 having angled portions, the angular displacement of the angled portions relative to the corresponding segment of the dambar 20 to which such third leads 32 are integrally connected progressively increases as such third leads 32 approach an adjacent one of the tie bars 26. In the leadframe 12, the first and second leads 28, 30 are integrally connected to the common tie ring 22 so as to be disposed in a staggered or offset relationship relative to each other. Thus, none of the first leads 28 of any set thereof is linearly aligned with a respective one of the second leads 30 of the corresponding set thereof. Rather, each of the first leads 28 of each set thereof is linearly aligned with a respective one of those third leads 32 of the corresponding set thereof which do not include an angled portion. However, though not shown, it is contemplated that the leadframe 12 may be configured such that each of the first leads 28 of each set thereof is substantially aligned with a respective one of the second leads 30 of the corresponding set thereof.

In the semiconductor package 10, each of the first leads 28 defines opposed, generally planar top and bottom lead surfaces, the bottom lead surfaces defining terminals 34 of the semiconductor package 10 which will be discussed in more detail below. Additionally, each of such first leads 28 includes an enlarged inner end or tip structure 36 which may be formed through the implementation of a partial (half) etching procedure or a coining procedure, and is used to provide a locking feature to strengthen the engagement between the first leads 28 and the package body 18 subsequent to the singulation or removal of the tie ring 22 as will also be discussed in more detail below. If such locking feature is provided, it is contemplated that each first lead 28 may include a shoulder or shelf which is recessed relative to the bottom lead surface thereof and defines the bottom surface of the tip structure 36, such shoulder or shelf further being disposed in opposed relation to that portion of the top lead surface of the corresponding first lead 28 which defines the top surface of the tip structure 36. Those of ordinary skill in the art will recognize that the above-described tip structure 36 described in relation to the first lead 28 may optionally be substituted with ear portions or other alternative locking structures.

Figure 3:
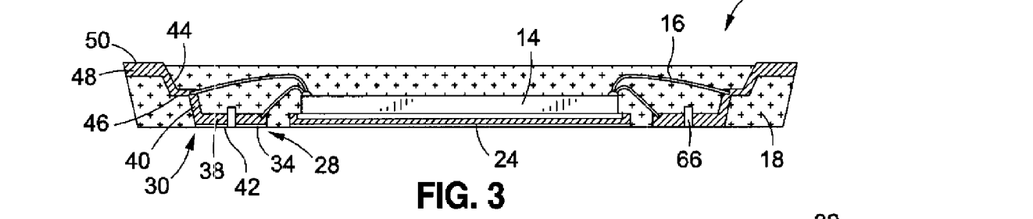
FIG. 3 is a cross-sectional view of the semiconductor package of the first embodiment of the present invention taken along line 3-3 of FIG. 2.

As seen in FIGS. 3 and 4, in the semiconductor package 10, each of the second leads 30 defines an inner end portion 38 which extends and is attached to a corresponding segment of the tie ring 22. Each of the second leads 30 also includes a first downset 40 formed therein in relative close proximity to the inner end portion 38. In this regard, the inner end portion 38 of each second lead 30 is disposed between the first downset 40 thereof and the tie ring 22. The inner end portion 38 defines opposed top and bottom surfaces which extend in generally coplanar relation to respective ones of the top and bottom paddle surfaces defined by the die paddle 24. The bottom surface of the inner end portion 38 of each second lead 30 further defines a terminal 42 of the semiconductor package 10, the use of which will be described in more detail below. In addition to the first downset 40, each of the second leads 30 includes a second downset 44 formed therein between the first downset 40 and the dambar 20. Defined between the first and second downsets 40, 44 is a wire bond zone 46 which extends in spaced, generally parallel relation to the die paddle 24 and hence the inner end portion 38 of the corresponding second lead 30. Each second lead 30 further defines an outer end portion 48 which also extends in spaced, generally parallel relation to the die paddle 24, and is located between the second downset 44 and the dambar 20. The outer end portion 48 defines opposed top and bottom surfaces, with the top surface of the outer end portion 48 of each second lead 30 further defining a terminal 50 of the semiconductor package 10, the use of which will be described in more detail below.

Figure 3A:
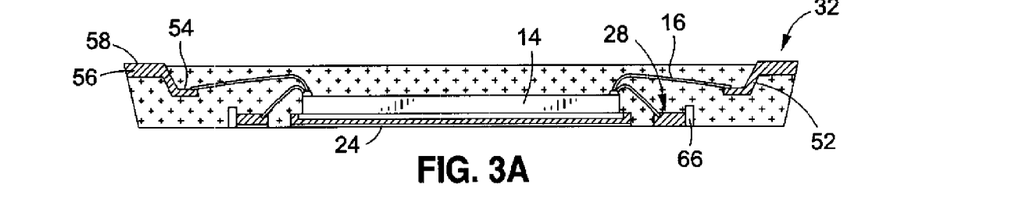
FIG. 3A is a cross-sectional view of the semiconductor package of the first embodiment of the present invention taken along line 3A-3A of FIG. 2.

As seen in FIGS. 3A and 4, similar to the second leads 30, each of the third leads 32, including those which define an angled portion, have a downset 52 formed therein. As a result of the formation of the downset 52 therein, each such third lead 32 defines a wire bond zone 54 which is disposed between the downset 52 and the tie ring 22, and extends in generally co-planar relation to the wire bond zones 46 of the second leads 30. Each third lead 32 further defines an outer end portion 56 which extends between the downset 52 and a corresponding segment of the dambar 20, and outwardly beyond such segment of the dambar 20 as best seen in FIG. 4. The outer end portion 56 defines opposed top and bottom surfaces, with the top surface of the outer end portion 56 of each third lead 30 further defining a terminal 58 of the semiconductor package 10, the use of which will be described in more detail below. For those third leads 32 including the angled portion, the majority of such angled portion is defined by the segment of the outer end portion 56 which extends inwardly from the dambar 20, as also seen in FIG. 4. The outer end portions 48 of the second leads 30 extend in generally coplanar relation to the outer end portions 56 of the third leads 32, with the outer end portions 48, 56 all extending in generally coplanar relation to the dambar 20.

As is seen in FIG. 4, each of the tie bars 26 is formed to include a downset 60 therein, thus effectively suspending the die paddle 24 within the dambar 20 in substantially co-planar relation to the first leads 28 and the inner end portions 38 of the second leads 30. Each tie bar 26 includes an outer end portion 62 which extends between the downset 60 and the dambar 20, each such outer end portion 62 defining opposed top and bottom surfaces, with the top surface of the outer end portion 62 of each tie bar 26 further defining a terminal 64 of the semiconductor package 10, the use of which will be described in more detail below. As a result of the formation of the downset 60 in each of the tie bars 26, the die paddle 24 of the leadframe 12 results on a plane which is disposed below the plane of the dambar 20, as well as the wire bond zones 46, 54 of the second and third leads 30, 32. In particular, the die paddle 24, the first leads 28 and the inner end portions 38 of the second leads 30 reside on a common first plane, with the wire bond zones 46, 54 of the second and third leads 30, 32 residing on a second plane which is disposed in spaced, generally parallel relation to the first plane. The outer end portions 48, 56 of the second and third leads 30, 32, the outer end portions 62 of the tie bars 26, and the dambar 20 each reside on a third plane which is itself disposed in spaced, generally parallel relation to the first and second planes, the second plane being disposed between the first and third planes. It is also contemplated that the terminals 34, 42 defined by the each of the first and second leads 28, 30 will extend in generally co-planar relation to the bottom paddle surface of the die paddle 24 and to each other. Similarly, it is also contemplated that the top surface of each inner end portion 38 which is opposed to the terminal 42 defined thereby and the top surface of each first lead 28 which is opposed to the terminal 34 defined thereby will extend in generally co-planar relation to the top paddle surface of the die paddle 24 and to each other. It is further contemplated that the terminals 50, 58 defined by the each of the second and third leads 30, 32 and the terminals 64 defined by the tie bars 26 will extend in generally co-planar relation to each other as well.

The leadframe 12 of the semiconductor package 10 is preferably fabricated from a conventional metal material, such as copper, copper alloy, steel plated with copper, or a functional equivalent. However, those of ordinary skill in the art will recognize that the present invention is not limited to any particular material for the leadframe 12. Additionally, the number of first, second and third leads 28, 30, 32 shown in FIG. 4 is for illustrative purposes only, and may be modified according to application field. Along these lines, the first, second and third leads 28, 30, 32 may have designs or configurations varying from those shown in FIG. 4 without departing from the spirit and scope of the present invention. Additionally, though the first, second and third leads 28, 30, 32 are each shown as each being segregated into four sets, it will be recognized that fewer sets of the first, second and third leads 28, 30, 32 may be provided, and may be arranged along any combination of two or three of the peripheral sides of the die paddle 24. Moreover, less than four tie bars 26 may be included in the leadframe 12, extending to respective corners of the die paddle 24 in any combination. It is further contemplated that the leadframe 12 may be fabricated through the implementation of a chemical etching process or alternatively a mechanical stamping process. Still further, it is contemplated that the leadframe 12 may alternatively be configured such that only one set of terminals are ultimately exposed in the bottom surface of the package body of the completed semiconductor package. For example, the first leads 28 may be eliminated in their entirety from the leadframe 12, thus resulting in only the terminals 42 defined by the second leads 30 being exposed in the bottom surface of the package body 18. Along these lines, numerous alternative configurations for the leadframe 12 are contemplated to be within the spirit and scope of the present invention, such as those disclosed in commonly owned pending U.S. application Ser. Nos. 11/425, 505 filed Jun. 21, 2006 and 11/775,566 filed Jul. 10, 2007, the disclosures of which are incorporated herein by reference.

In the semiconductor package 10, the semiconductor die 14 is attached to the top paddle surface of the die paddle 24, such attachment preferably being facilitated through the use of a suitable die attach material, such as an adhesive. Included on the top surface of the semiconductor die 14 is a plurality of bond pads or terminals. In the semiconductor package 10, these terminals of the semiconductor die 14 are electrically connected to respective ones of the first, second and third leads 28, 30, 32 through the use of the conductive wires 16. In FIG. 4, only a few exemplary wires 16 are depicted, those of ordinary skill in the art recognizing that the semiconductor package 10 will typically include wires 16 in a suitable number which effectively electrically connects the semiconductor die 14 to virtually all of the first, second and third leads 28, 30, 32 included in the leadframe 12. It is contemplated that for each first lead 28, a corresponding wire 16 will be extended to the top surface thereof opposite the terminal 34 defined thereby. For each second lead 30, it is contemplated that a corresponding wire 16 will be extended to the wire bond zone 46 defined thereby. For each third lead 32, it is contemplated that the corresponding wire 16 will be extended to the wire bond zone 54 defined thereby. The conductive wires 16 may be fabricated from aluminum, copper, gold, silver, or a functional equivalent. However, those of ordinary skill in the art will recognize that the present invention is not limited to any particular material for the wires 16.

Figure 1:
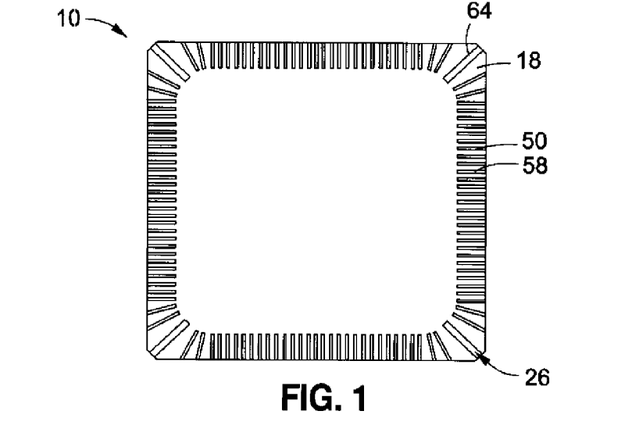
FIG. 1 is a top plan view of a semiconductor package constructed in accordance with a first embodiment of the present invention.
Figure 2:
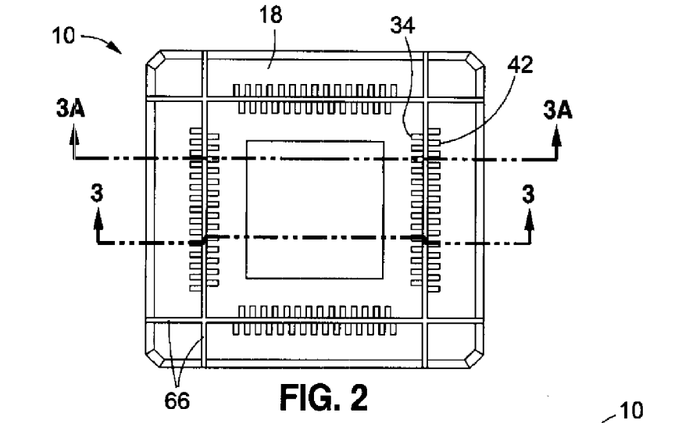
FIG. 2 is a bottom plan view of the semiconductor package shown in FIG. 1.

In the semiconductor package 10, the die paddle 24, the first, second and third leads 28, 30, 32, the tie bars 26, the semiconductor die 14 and the conductive wires 16 are at least partially encapsulated or covered by an encapsulant material which, upon hardening, forms the package body 18 of the semiconductor package 10. As best seen in FIGS. 2 and 3, in the completed semiconductor package 10, the generally planar terminals 34, 42 defined by the first and second leads 28, 30 are exposed in and substantially flush with a generally planar bottom surface defined by the fully formed package body 18. Also exposed in and substantially flush with the bottom surface of the package body 18 is the generally planar bottom paddle surface of the die paddle 24. Though not shown in FIG. 2, portions of the tie bars 26 which extend between the down sets 60 and respective corners of the die paddle 24 may also be exposed in and substantially flush with the bottom surface of the package body 18. As seen in FIG. 1, the package body 18 is further formed such that the terminals 50, 58, 64 defined by the second and third leads 30, 32 and the tie bars 26 are exposed in and substantially flush with a generally planar top surface defined by the fully formed package body 18, such top surface being disposed in opposed relation to the bottom surface thereof having the terminals 34, 42 disposed therein.

In fabricating the semiconductor package 10, the package body 18 is formed on the leadframe 12 such that the dambar 20 and those portions of the third leads 32 extending outwardly from the dambar 20 are not covered by the package body 18, and thus remain exposed therein. As will be recognized, in order to complete the fabrication of the semiconductor package 10 to allow the same to assume the configuration shown in FIGS. 1, 2 and 3, the dambar 20 must be removed from the leadframe 12 to facilitate the electrical isolation of the second and third leads 30, 32 from each other. In this regard, it is contemplated that a conventionally known debarring process may be implemented to remove the dambar 20 as needed to electrically isolate the second leads 30 and the third leads 32 from each other. The completion of such debarring process results in each of the second leads 30 defining an outer, distal end which is exposed in and substantially flush with a respective side surface defined by the package body 18. Further, upon the completion of such debarring process, the portions of the third leads 32 protruding outwardly from the package body 18 are also removed in a manner which results in each of the third leads 32 defining an outer, distal end which is exposed in and substantially flush with a respective side surface defined by the package body 18.

In addition to electrically isolating the second and third leads 30, 32 from each other in the above-described manner, in fabricating the semiconductor package 10, it is further necessary to effectively facilitate the electrical isolation of the first and second leads 28, 30 from each other. In this regard, subsequent to the formation of the package body 18, it is contemplated that the package body 18 will be subjected to a partial sawing process. In this partial sawing process, a saw blade is penetrated into the bottom surface of the package body 18 to a depth and along axes which facilitate the severing or removal of the tie ring 22, thus electrically isolating the first leads 28 from each other and from the second leads 30. The artifact which remains in the bottom surface of the package body 18 as a result of such partial sawing or singulation step are four elongate, generally straight grooves 66 which are arranged in a generally quadrangular pattern as shown in FIG. 2. Advantageously, in the semiconductor package 10, the connection of the first and second leads 28, 30 to the common tie ring 22 and the connection of the second and third leads 30, 32 to the common dambar 20 maintains tight positional consistency in relation to the relative orientations of the first, second and third leads 28, 30, 32. Further, the encapsulation of the first and second downsets 40, 44 of the second leads 30 and the downsets 52 of the third leads 32 by the package body 18 facilitates the anchoring or locking of the second and third leads 30, 32 to the package body 18, thus eliminating the need to form any locking features therein via a half-etching or coining technique. The locking of the first leads 28 to the package body 18 is facilitated by the above-described tip structures 36. In the semiconductor package 10, it is contemplated that the grooves 66 may be formed so as to not to sever any of the tie bars 26, thus maintaining a electrically conductive path between the terminals 64 of the tie bars 26 exposed in the package body 18 and the die paddle 24.

Figure 5:
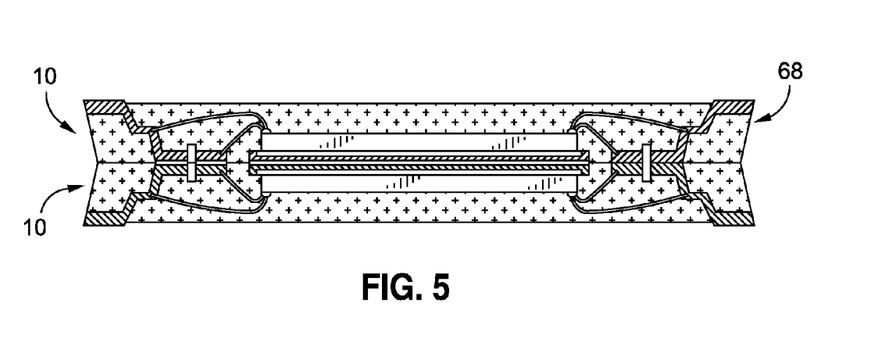
FIG. 5 is a cross-sectional view of a package stack comprising a stacked pair of the semiconductor packages of the first embodiment shown in FIG. 3.

In the semiconductor package 10, the exposure of the terminals 34, 42 in the bottom surface of the package body 18, and the exposure of the terminals 50, 56 in the top surface of the package body 18 makes the semiconductor package 10 well suited for stacking with either a second, identically configured semiconductor package 10, or a semiconductor package or other electronic device having differing structural attributes. In this regard, FIG. 5 depicts an exemplary package stack 68 which comprises a stacked pair of the semiconductor packages 10 shown in FIGS. 1-3. In the package stack 68, the exposed terminals 34, 42 of a first one of the semiconductor packages 10 are aligned with and electrically connected to respective ones of the terminals 34, 42 of the remaining semiconductor package 10 of the package stack 68. Additionally, the exposed bottom surfaces of the die paddles 24 of the semiconductor packages 10 within the package stack 68 are disposed in abutting contact with each other in the manner also shown in FIG. 5. In the package stack 68, the exposed terminals 50, 58 of each of the semiconductor packages 10 may be used to facilitate the electrical connection of the package stack 68 to an underlying substrate such as a printed circuit board and/or the electrical connection of other semiconductor packages or electronic devices to the package stack 68.

Figure 6:
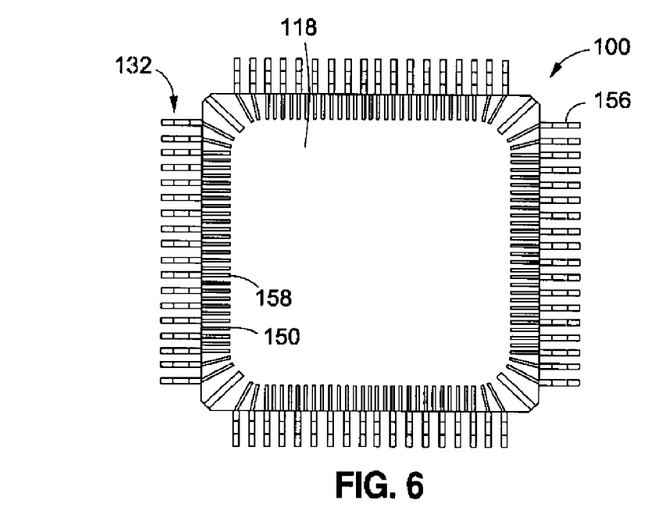
FIG. 6 is a top plan view of a semiconductor package constructed in accordance with a second embodiment of the present invention.
Figure 7:
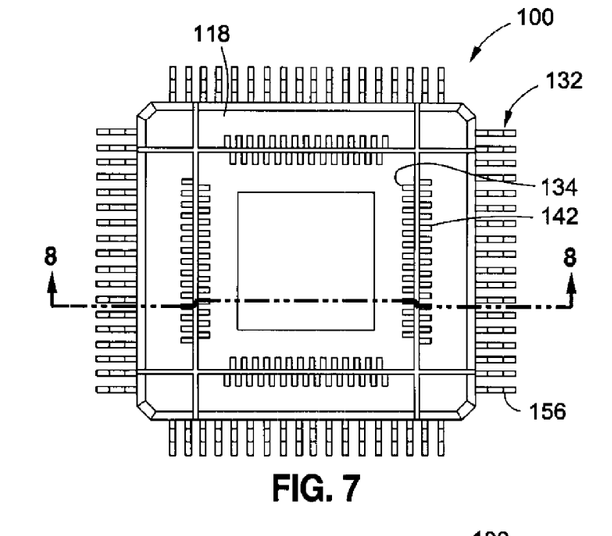
FIG. 7 is a bottom plan view of the semiconductor package shown in FIG. 6.
Figure 8:
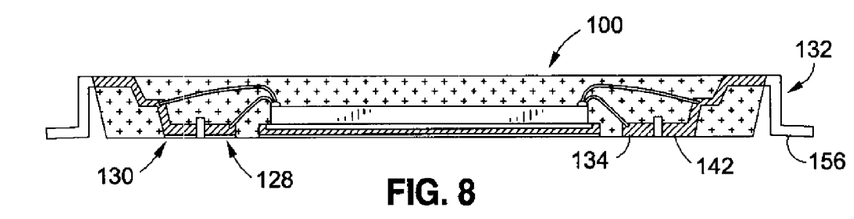
FIG. 8 is a cross-sectional view of the semiconductor package of the second embodiment of the present invention taken along line 8-8 of FIG. 7.

Referring now to FIGS. 6-8, there is shown a semiconductor package 100 constructed in accordance with a second embodiment of the present invention. The semiconductor package 100 is substantially similar in construction to the above-described semiconductor package 10, but includes a leadframe 112 which comprises a relatively minor variation of the leadframe 12 shown and described above. In this regard, only the distinctions between the semiconductor packages 10, 100, and in particular the leadframes 12, 112 thereof, will be described below. Along these lines, the one hundred series reference numbers included in FIGS. 6-8 are used to identify the same structures as identified by the corresponding ten series reference numbers included in FIGS. 1-4.

As previously indicated, in the semiconductor package 10, subsequent to the full formation of the package body 18, the portions of the third leads 32 protruding from the package body 18 are removed in a manner which results in each of the third leads 32 defining an outer, distal end which is exposed in and substantially flush with a respective side surface defined by the package body 18. In contrast, in the semiconductor package 100, the exposed distal portions of the outer end portions 156 of the third leads 132 which protrude from respective ones of the multiple side surfaces defined by the package body 118 are not removed. Rather, these exposed portions of the outer end portions 156 of the third leads 132 are preferably bent so as to impart a generally gull-winged configuration thereto in the manner shown in FIGS. 6-8. As best seen in FIG. 8, the bottom surfaces or terminals defined by the bent portions of the outer end portions 156 extend in generally co-planar relation to the terminals 134, 142 defined by respective ones of the first and second leads 128, 130 of the semiconductor package 100.

Figure 9:
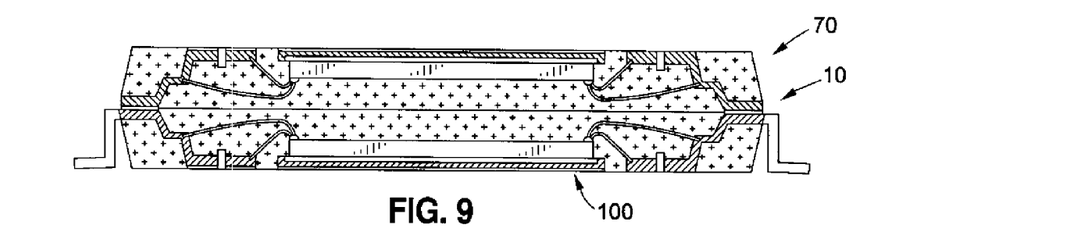
FIG. 9 is a cross-sectional view of a package stack comprising a semiconductor package of the first embodiment shown in FIG. 3 as stacked upon a semiconductor package of the second embodiment shown in FIG. 8.

Like the semiconductor package 10 described above, the semiconductor package 100 is also well suited for integration into a package stack. In this regard, FIG. 9 depicts a package stack 70 wherein a semiconductor package 10 of the first embodiment is stacked upon a semiconductor package 100 of the second embodiment. More particularly, in the package stack 70, the terminals 50, 58 of the semiconductor package 10 are aligned with and electrically connected to respective ones of the terminals 150, 158 of the underlying semiconductor package 100. The exposed terminals 34, 42 of the semiconductor package 10, the exposed terminals 134, 142 of the semiconductor package 100, and the terminals defined by the exposed, bent portions of the third leads 132 of the semiconductor package 100 allow for the mounting and electrical connection of the package stack 70 to an underlying substrate such as a printed circuit board and/or the electrical connection of other semiconductor packages or electronic devices to the package stack 70.

Figure 10:
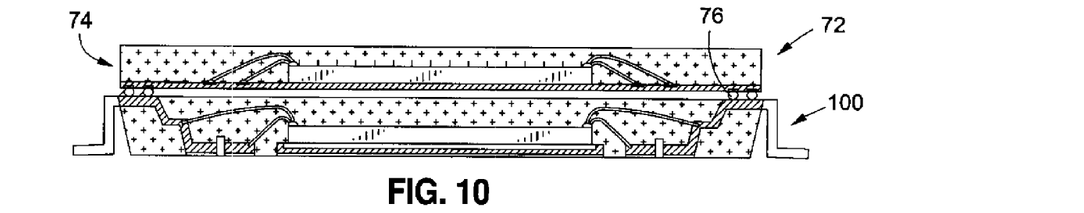
FIG. 10 is a cross-sectional view of a package stack comprising a conventional BGA (ball grid array) semiconductor package as stacked upon a semiconductor package of the second embodiment shown in FIG. 8.
Figure 11:
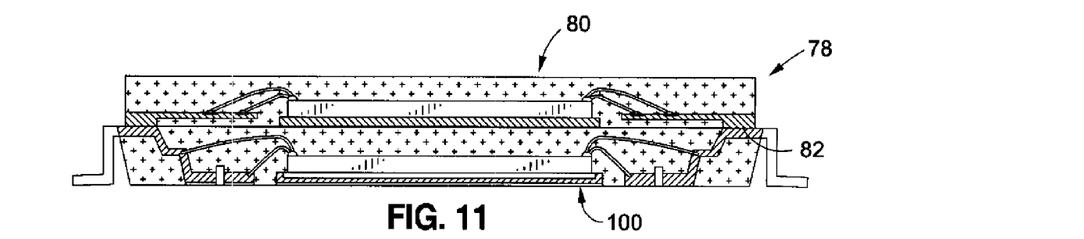
FIG. 11 is a cross-sectional view of a package stack comprising a conventional QFN (quad flat package, no leads) semiconductor package as stacked upon a semiconductor package of the second embodiment shown in FIG. 8.
Figure 12:
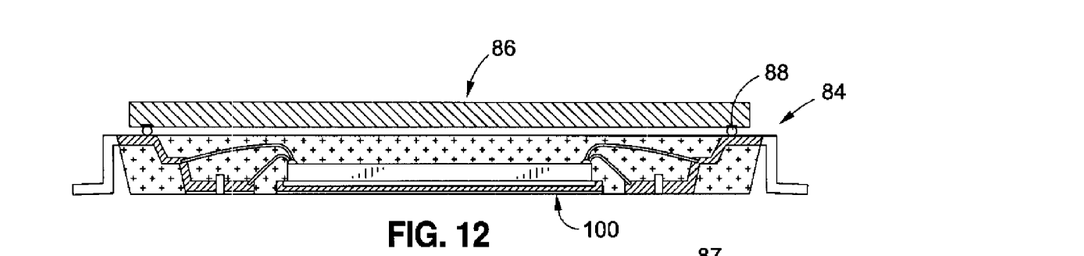
FIG. 12 is a cross-sectional view of a package stack comprising a conventional WLP (wafer level package) semiconductor package as stacked upon a semiconductor package of the second embodiment shown in FIG. 8.
Figure 13:
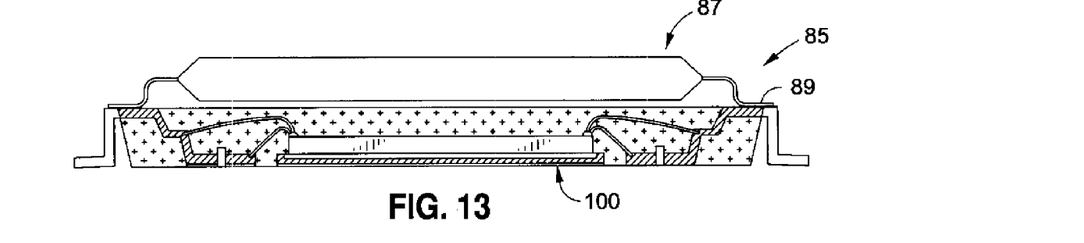
FIG. 13 is a cross-sectional view of a package stack comprising a conventional TSOP (thin small outline package) semiconductor package as stacked upon a semiconductor package of the second embodiment shown in FIG. 8.

The package stack 100 of the second embodiment is also capable of having electronic components such as semiconductor packages stacked thereon and electrically connected thereto, other than for the semiconductor package 10 as shown and described in relation to the package stack 70. For example, FIG. 10 depicts a package stack 72 wherein a conventional BGA (ball grid array) semiconductor package 74 is stacked upon a semiconductor package 100 of the second embodiment. More particularly, in the package stack 72, conductive balls 76 of the semiconductor package 74 are aligned with and electrically connected to respective ones of the terminals 150, 158 of the underlying semiconductor package 100. The exposed terminals 134, 142 of the semiconductor package 100, and the terminals defined by the exposed, bent portions of the third leads 132 of the semiconductor package 100 allow for the mounting and electrical connection of the package stack 72 to an underlying substrate such as a printed circuit board. FIG. 11 depicts a package stack 78 wherein a conventional QFN (quad flat package, no leads) semiconductor package 80 is stacked upon a semiconductor package 100 of the second embodiment. More particularly, in the package stack 78, exposed terminals 82 of the semiconductor package 80 are aligned with and electrically connected to respective ones of the terminals 150, 158 of the underlying semiconductor package 100. The exposed terminals 134, 142 of the semiconductor package 100, and the terminals defined by the exposed, bent portions of the third leads 132 of the semiconductor package 100 allow for the mounting and electrical connection of the package stack 78 to an underlying substrate such as a printed circuit board. FIG. 12 depicts a package stack 84 wherein a conventional WLP (wafer level package) semiconductor package 86 is stacked upon a semiconductor package 100 of the second embodiment. More particularly, in the package stack 84, conductive balls 88 of the semiconductor package 86 are aligned with and electrically connected to respective ones of the terminals 150, 158 of the underlying semiconductor package 100. The exposed terminals 134, 142 of the semiconductor package 100, and the terminals defined by the exposed, bent portions of the third leads 132 of the semiconductor package 100 allow for the mounting and electrical connection of the package stack 84 to an underlying substrate such as a printed circuit board. FIG. 13 depicts a package stack 85 wherein a conventional TSOP (thin, small outline package) 87 is stacked upon a semiconductor package 100 of the second embodiment. More particularly, in the package stack 85, exposed terminals 89 of the semiconductor package 85 are aligned with and electrically connected to respective ones of the terminals 150, 158 of the underlying semiconductor package 100. The exposed terminals 134, 142 of the semiconductor package 100, and the terminals defined by the exposed, bent portions of the third leads 132 of the semiconductor package 100 allow for the mounting and electrical connection of the package stack 78 to an underlying substrate such as a printed circuit board.

In FIGS. 9-13, the semiconductor packages 10, 74, 80, 86, 87 are shown as being stacked upon the underlying semiconductor package 100. Though not shown, those of ordinary skill in the art will recognize that in the package stacks 70, 72, 78, 84, 85, the underlying semiconductor package 100 may be substituted with the semiconductor package 10, with the top semiconductor packages 10, 74, 80, 86, 87 being electrically connected to the exposed terminals 50, 58 of the underlying semiconductor package 10. Further, in the package stack 68 shown in FIG. 5, an alternative stacked arrangement is contemplated wherein the terminals 50, 58 of one of the semiconductor packages 10 in the stack are aligned with and electrically connected to respective ones of the terminals 50, 58 of the remaining semiconductor package 10 in the stack. Thus, based on the structural attributes of the semiconductor packages 10, 100 described above, a multiplicity of different potential package stack arrangements which include either or both of the semiconductor packages 10, 100, possibly in combination with other types of semiconductor packages or other electronic devices, are contemplated to be within the spirit and scope of the present invention.

Figure 14:
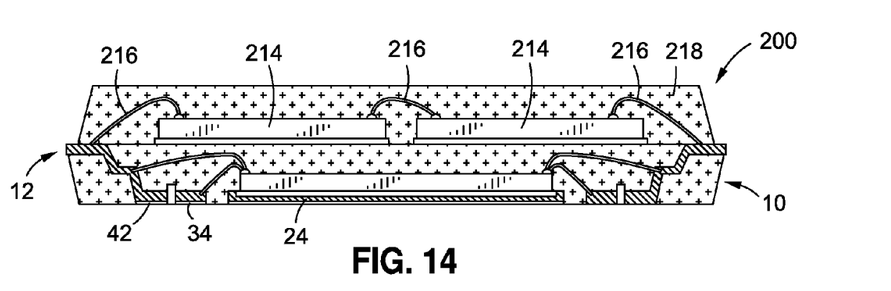
FIG. 14 is a cross-sectional view of a semiconductor package constructed in accordance with a third embodiment of the present invention.
Figure 15:
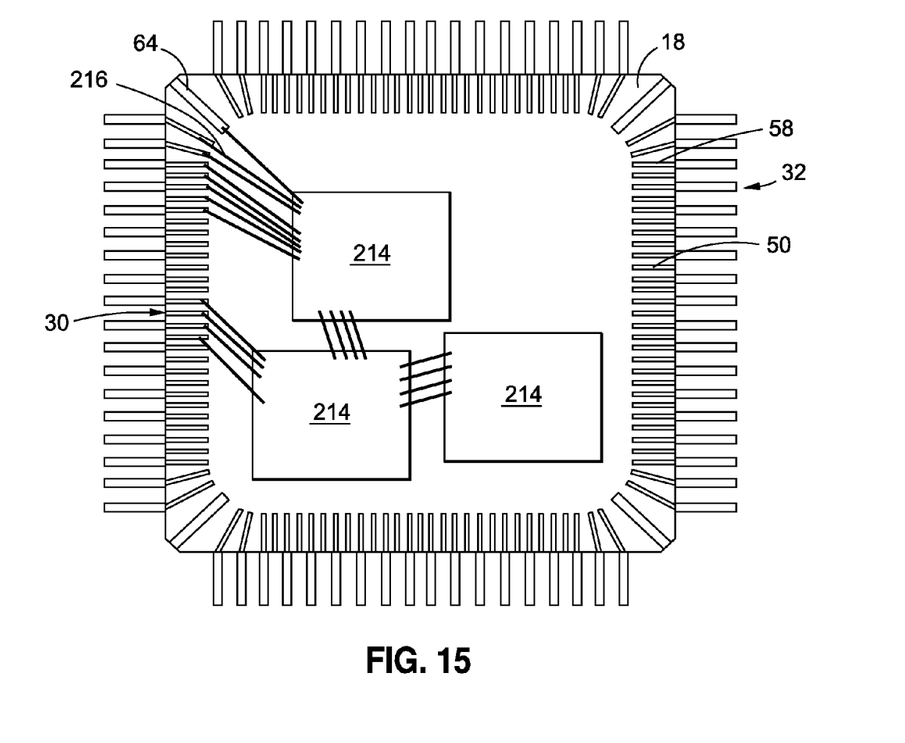
FIG. 15 is a top plan view of the semiconductor package of the third embodiment in a partially fabricated state.

Referring now to FIGS. 14 and 15, there is shown a semiconductor package 200 constructed in accordance with a third embodiment of the present invention. In FIG. 15 the semiconductor package 200 is shown in a partially fabricated state. The semiconductor package 200 essentially comprises the above-described semiconductor package 10 as further outfitted with one or more additional semiconductor dies which are electrically connected to the leadframe 12 and covered by an ancillary mold cap as will be described in more detail below.

The fabrication of the semiconductor package 200 begins with the fabrication of the above-described semiconductor package 10. In fabricating the semiconductor package 200, either prior or subsequent to the portions of the third leads 32 protruding from the package body 18 of the semiconductor package 10 being removed in the above-described manner, one or more additional semiconductor dies 214 are attached to the top surface of the package body 18 of the underlying semiconductor package 10 in the open area circumvented by the exposed terminals 50, 58 defined by the second and third leads 30, 32 of the semiconductor package 10. The semiconductor die(s) 214 is/are electrically connected to the terminals 50, 58 (any may be electrically connected to each other) in any pattern or arrangement through the use of conductive wires 216. Those of ordinary skill in the art will recognize that the three semiconductor dies 214 shown in FIG. 15 is exemplary only, in that one, two or greater than three such semiconductor dies 214 may be attached to the top surface of the package body 18 without departing from the spirit and scope of the present invention. Similarly, the electrical connection pattern shown in FIG. 15 between the semiconductor dies 214 and the terminals 50, 58 is also exemplary only. As is further shown in FIG. 15, the semiconductor die(s) 214 may further be electrically connected to the exposed terminal(s) 64 of one or more of the tie bars 26 through the use of one or more of the conductive wires 216. It is contemplated that the semiconductor die(s) 214 may be attached to the top surface of the underlying package body 18 through the use of, for example, a layer of a suitable adhesive.

Subsequent to the attachment of the semiconductor die(s) 214 to the top surface of the package body 18 and the electrical connection of the semiconductor die(s) 214 to the leadframe 12 of the underlying semiconductor package 10 in a prescribed manner, a mold cap 218 is formed on the top surface of the package body 18 in a manner covering or encapsulating the semiconductor die(s) 214 and the conductive wires 216. As seen in FIG. 14, the mold cap 218 also covers substantial portions of the terminals 50, 58 defined by the second and third leads 30, 32 of the underlying semiconductor package 10. In this regard, small, distal sections of the terminals 50, 58 remain uncovered by the fully formed mold cap 218, and thus are exposed. If the portions of the third leads 32 protruding from the package body 18 are not removed prior to the attachment of the semiconductor die(s) 214 to the package body 218, such removal will occur subsequent to the formation of the mold cap 218.

Figure 16:
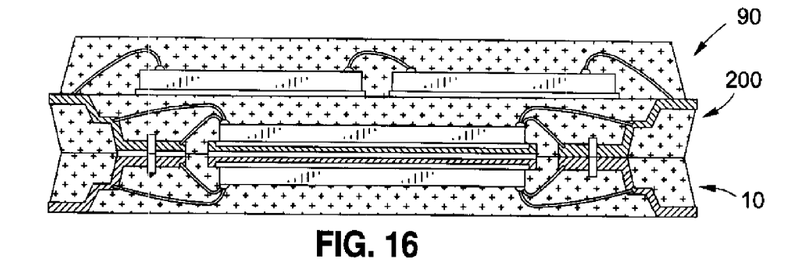
FIG. 16 is a cross-sectional view of a package stack comprising a semiconductor package of the third embodiment shown in FIG. 13 as stacked upon a semiconductor package of the first embodiment shown in FIG. 3.

The semiconductor package 200 of the third embodiment is also well suited for stacking with another semiconductor package or other electronic device. In this regard, FIG. 16 depicts a package stack 90 wherein a semiconductor package 200 of the third embodiment is stacked upon a semiconductor package 10 of the first embodiment. More particularly, in the package stack 90, the terminals 34, 42 of the semiconductor package 200 are aligned with and electrically connected to respective ones of the terminals 34, 42 of the underlying semiconductor package 10. Additionally, the exposed bottom surfaces of the die paddles 24 of the semiconductor packages 200, 10 within the package stack 90 are disposed in abutting contact with each other in the manner also shown in FIG. 16. In the package stack 90, the exposed terminals 50, 58 of the underlying semiconductor package 10 may be used to facilitate the electrical connection of the package stack 90 to an underlying substrate such as a printed circuit board.

Figure 17:
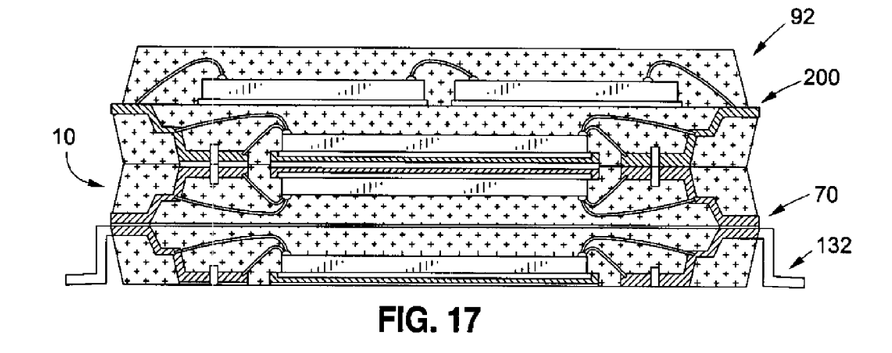
FIG. 17 is a cross-sectional view of a package stack comprising a semiconductor package of the third embodiment shown in FIG. 13 as stacked upon the package stack shown in FIG. 9.

FIG. 17 depicts a package stack 92 wherein a semiconductor package 200 of the third embodiment shown in FIG. 14 is stacked upon the above-described package stack 70 shown in FIG. 9. In the package stack 92, the exposed terminals 34, 42 of the semiconductor package 200 are aligned with and electrically connected to respective ones of the terminals 34, 42 defined by the semiconductor package 10 within the package stack 70, in the manner shown in FIG. 17. Additionally, the exposed bottom surfaces of the die paddles 24 of the semiconductor packages 200, 10 within the package stack 92 are disposed in abutting contact with each other in the manner also shown in FIG. 17. In the package stack 92, the exposed terminals 134, 142 of the semiconductor package 100, and the terminals defined by the exposed, bent portions of the third leads 132 of the semiconductor package 100, allow for the mounting and electrical connection of the package stack 92 to an underlying substrate such as printed circuit board. Those of ordinary skill in the art will recognize that the package stacks 90, 92 shown in FIGS. 16, 17 are intended to be exemplary configurations only, and that the semiconductor package 200 of the third embodiment may be integrated into any one of a multiplicity of differently configured package stacks in combination with one or more of the semiconductor packages 10, 100, another semiconductor package 200, and/or other electronic devices such as the semiconductor packages 74, 80 and 86.

Figure 18:
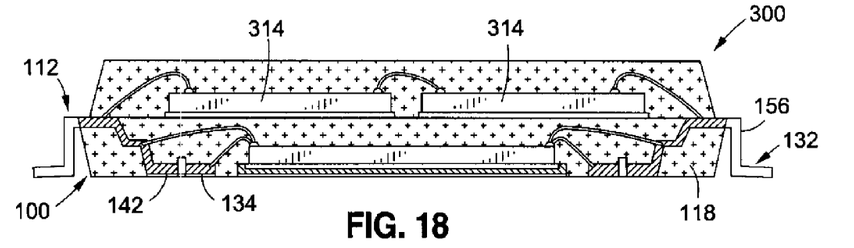
FIG. 18 is a cross-sectional view of a semiconductor package constructed in accordance with a fourth embodiment of the present invention.

Referring now to FIG. 18, there is shown a semiconductor package 300 constructed in accordance with a fourth embodiment of the present invention. The semiconductor package 300 is substantially similar in construction to the above-described semiconductor package 200. In this regard, the semiconductor package 300 differs from the semiconductor package 200 only in that in the semiconductor package 300, the base component to which the semiconductor die(s) 314 are mounted is the above-described semiconductor package 100, as opposed to such base component comprising the semiconductor package 10 as is the case in the semiconductor package 200. Thus, in the semiconductor package 300, the exposed distal portions of the outer end portions 156 of the third leads 132 which protrude from respective ones of the multiple side surfaces defined by the package body 118 are not removed as in the semiconductor package 200, but rather are bent so as to import a generally gull-winged configuration thereto in the manner shown in FIG. 18. The bottom surfaces or terminals defined by the bent portions of the outer end portions 156 extend in generally co-planar relation to the terminals 134, 142 of the semiconductor package 300. Though not shown, those of ordinary skill in the art will recognize that the semiconductor package 300 may be integrated into any package stack in accordance with the possible variants described above in relation to the semiconductor packages 10, 100, 200. Additionally, in both the semiconductor package 200 and the semiconductor package 300, it is contemplated that the semiconductor die(s) 214, 314 may be attached and electrically connected to a laminate interposer which is in turn attached to the top surface of the underlying semiconductor package 10, 100 and electrically connected to the leadframe 12, 112 thereof.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
a generally planar die paddle defining multiple peripheral edge segments;
a plurality of first leads segregated into at least two sets which extend along respective ones of at least two peripheral edge segments of the die paddle;
a plurality of second leads which each include first and second downsets formed therein in spaced relation to each other, the second leads being segregated into at least two sets which extend along respective ones of at least two peripheral edge segments of the die paddle;
a plurality of third leads, at least some of which include a downset formed therein, the third leads being segregated into at least two sets which extend along respective ones of at least two peripheral edge segments of the die paddle;
a semiconductor die attached to the die paddle and electrically connected to at least one of each of the first second and third leads; and
a package body defining opposed, generally planar top and bottom surfaces and multiple side surfaces, the package body at least partially encapsulating the first, second and third leads and the semiconductor die such that the first and second downsets of the second leads and the downsets of the third leads are covered by the package body, at least portions of the die paddle and the first and second leads are exposed in and substantially flush with the bottom surface of the package body, and at least portions of the second and third leads are exposed in and substantially flush with the top surface of the package body.

2. The semiconductor package of claim 1 wherein at least some of the first leads are formed to include an enlarged locking tip structure to facilitate the anchoring thereof to the package body.

3. The semiconductor package of claim 1 wherein the die paddle has a generally quadrangular configuration, and the first, second and third leads are segregated into at least four sets which each extend along a respective one of the peripheral edge segments of the die paddle.

4. The semiconductor package of claim 1 wherein the semiconductor die is electrically connected to the first, second and third leads by conductive wires which are covered by the package body.

5. The semiconductor package of claim 4 wherein:
each of the first leads defines a terminal which is exposed in the bottom surface of the package body;
each of the second leads includes an inner end portion, a wire bond zone, and an outer end portion, the inner end portion being disposed between the first downset thereof and the die paddle and defining a terminal which is exposed in the bottom surface of the package body, the first downset extending, between the inner end portion and the wire bond zone thereof, and the second downset extending between the wire bond zone and the outer end portion thereof;
each of the third leads includes a wire bond zone and an outer end portion, the downset of each of the third leads extending between the wire bond zone and the outer end portion thereof; and the conductive wires extend from the semiconductor die to respective ones of the first leads and the wire bond zones of the second leads and third leads.

6. The semiconductor package of claim 5 wherein the outer end portions of the second and third leads each define a terminal which is exposed in the top surface of the package body.

7. The semiconductor package of claim 5 wherein:
the die paddle, the first leads and the inner end portions of the second leads extend along a first plane;
the wire bond zones of the second and third leads each extend along a second plane which is disposed in spaced, generally parallel relation to the first plane; and
the outer end portions of the second and third leads each extend along a third plane which is disposed in spaced, generally parallel relation to the second plane such that the second plane extends between the first and third planes.

8. The semiconductor package of claim 5 wherein portions of the outer end portions of the third leads protrude from respective ones of the side surfaces of the package body and are bent to assume a gull-wing configuration.

9. The semiconductor package of claim 5 wherein the terminals defined by the first leads are offset relative to the terminals defined by the second leads.

10. A semiconductor package comprising:
a die paddle;
a plurality of second leads which each include first and second downsets formed therein in spaced relation to each other, the second leads extending along the die paddle;
a plurality of third leads, at least some of which include a downset formed therein, the third leads extending along the die paddle;
a semiconductor die attached to the die paddle and electrically connected to at least one of each of the first, second and third leads; and
a package body defining opposed top and bottom surfaces and multiple side surfaces, the package body at least partially encapsulating the second and third leads and the semiconductor die such that the first and second downsets of the second leads and the downsets of the third leads are covered by the package body, at least portions of the die paddle and the second leads are exposed in the bottom surface of the package body, and at least portions of the second and third leads are exposed in the top surface of the package body.

11. The semiconductor package of claim 10 wherein:
each of the second leads includes an inner end portion, a wire bond zone, and an outer end portion, the inner end portion being disposed between the first downset thereof and the die paddle and defining a terminal which is exposed in the bottom surface of the package body, the first downset extending between the inner end portion and the wire bond zone thereof, the second downset extending between the wire bond zone and the outer end portion thereof, and the outer end portion defining a terminal which is exposed in the top surface of the package body;
each of the third leads includes a wire bond zone and an outer end portion, the downset of each of the third leads extending between the wire bond zone and the outer end portion thereof, and the outer end portion defining a terminal which is exposed in the top surface of the package body; and conductive wires extend from the semiconductor die to respective ones of the wire bond zones of the second leads and third leads.

12. The semiconductor package of claim 11 wherein portions of the outer end portions of the third leads protrude from respective ones of the side surfaces of the package body and are bent to assume a gull-wing configuration.

13. The semiconductor package of claim 11 further comprising a plurality of first leads extending along the die paddle, the semiconductor die being electrically connected to at least one of the first leads and the package body at least partially encapsulating the first leads such that each of the first leads defines a terminal which is exposed in the bottom surface of the package body.

14. A semiconductor package comprising:
   a die paddle;
   a plurality of second leads which each include first and second downsets formed therein and define a wire bond zone between the first and second downsets, the second leads extending along the die paddle;
   a plurality of third leads, at least some of which include a downset formed therein, the third leads extending along the die paddle and each defining a wire bond zone between the downset thereof and the die paddle;
   a semiconductor die attached to the die paddle and electrically connected to at least one of each of the second and third leads; and
   a package body defining opposed top and bottom surfaces, the package body at least partially encapsulating the second and third leads and the semiconductor die such that the first and second downsets of the second leads and the downsets of the third leads are covered by the package body, at least portions of the die paddle and the second leads are exposed in the bottom surface of the package body, and at least portions of the second and third leads are exposed in the top surface of the package body.

* * * * *